United States Patent
Ghyselen et al.

(10) Patent No.: US 7,268,060 B2
(45) Date of Patent: Sep. 11, 2007

(54) METHOD FOR FABRICATING A SUBSTRATE WITH USEFUL LAYER ON HIGH RESISTIVITY SUPPORT

(75) Inventors: Bruno Ghyselen, Seyssinet-Pariset (FR); Hubert Moriceau, Saint Egreve (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 292 days.

(21) Appl. No.: 10/968,695

(22) Filed: Oct. 18, 2004

(65) Prior Publication Data
US 2005/0112845 A1 May 26, 2005

Related U.S. Application Data

(63) Continuation of application No. PCT/IB03/02237, filed on Apr. 23, 2003.

(30) Foreign Application Priority Data
Apr. 23, 2002 (FR) .................................... 02 05054

(51) Int. Cl.
H01L 21/30 (2006.01)

(52) U.S. Cl. ........................ 438/458; 438/455; 438/459

(58) Field of Classification Search ................ 438/455, 438/458, 459
See application file for complete search history.

(56) References Cited

U.S. PATENT DOCUMENTS

| 6,544,656 B1 | 4/2003 | Abe et al. ................ 428/446 |
| 2001/0055859 A1 | 12/2001 | Yamada et al. ............ 438/479 |

FOREIGN PATENT DOCUMENTS

| EP | 1 087 041 A1 | 3/2001 |
| EP | 1 168 428 A2 | 1/2002 |
| JP | 08-293589 | 11/1996 |
| JP | 2000-031439 | 1/2000 |
| WO | WO 0055397 A1 | 9/2000 |

*Primary Examiner*—N. Drew Richards
(74) *Attorney, Agent, or Firm*—Winston & Strawn LLP

(57) ABSTRACT

A method for fabricating a substrate containing a useful semiconductor layer on a support having high resistivity by: preparing a base substrate of a semiconductor material containing a controlled quantity of interstitial oxygen, heat treating the base substrate to achieve at least partial precipitation of the interstitial oxygen therein, removing a superficial layer over a controlled depth from a surface of the base substrate that intended to receive a useful layer, forming the useful layer on the surface of the base substrate, with the base substrate serving as a support for the useful layer. This method is applicable in particular to SOI substrates having high resistivity for use in forming high frequency electronic circuits.

Figure 1:
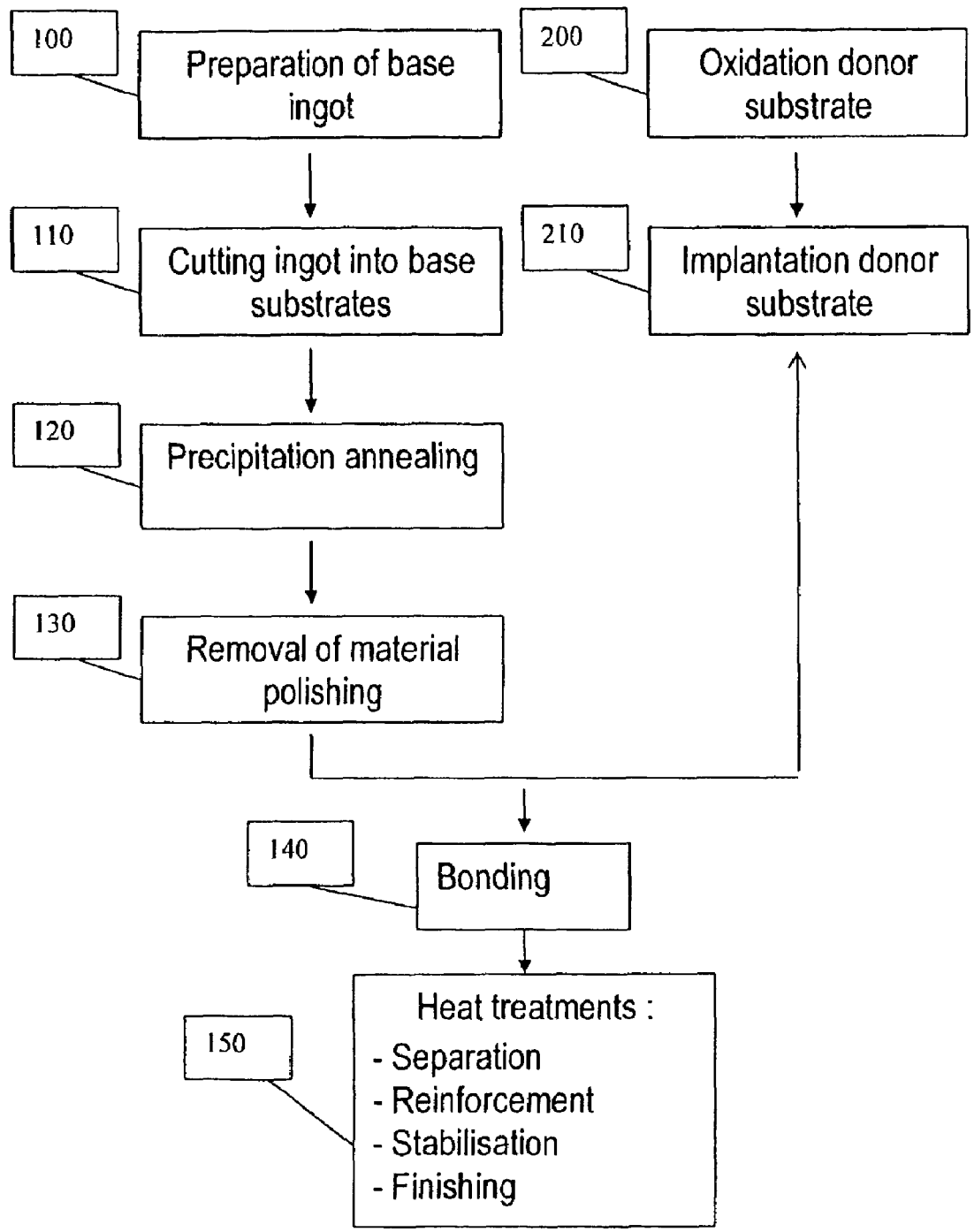

14 Claims, 2 Drawing Sheets

METHOD FOR FABRICATING A SUBSTRATE WITH USEFUL LAYER ON HIGH RESISTIVITY SUPPORT

CROSS-REFERENCE TO RELATED APPLICATIONS

This application is a continuation of International application PCT/IB03/02237 filed Apr. 23, 2003, the entire content of which is expressly incorporated herein by reference thereto.

BACKGROUND

The present invention generally relates to the manufacture of composite substrates based on semiconductors and in particular, those based on silicon, such as "SOI" (Silicon On Insulator) type substrates and even bulk silicon substrates.

More particularly, the invention aims to produce a substrate formed from a thin layer of single crystal silicon of suitable quality, or other semiconductor, on a solid base of high resistivity, typically greater than 1 KΩ.cm (the thin layer may be of any resistivity), such a substrate being described as "semi-insulating".

These substrates are used, for example, in microwave applications, where one wishes to integrate active and passive components (in particular inductances) on the same substrate.

Recourse to semi-insulating substrates to produce circuits operating at high and very high frequencies (typically of the order of several gigaherz for so-called "MMIC" (Microwave Integrated Circuit) circuits), limits high frequency losses due to Foucault currents in the mass of the support. This is why the support is conventionally made from gallium arsenide AsGa, known for its good intrinsic properties and high resistivity, typically of the order of 10 MΩ. cm.

Another justification for the use of highly resistive substrates for such circuits is associated with the manufacture of integrated passive components forming part of these circuits, whose quality factor must be as high as possible at the frequencies concerned. Now, for very high frequencies, the quality factor drops in the presence of conducting or semiconducting elements in the neighborhood of the component.

The concern above is to allow for this, consisting, in classical SOI substrates, in producing a very thin insulating layer between the useful part of the substrate and the remainder of it. In fact, it is a question in this context of eliminating as far as possible any conducting parts at distances of a few hundred μm or more and thereby obtaining high resistivity throughout the thickness of the support.

In terms of substrates with an insulating support, "SOQ" (Silicon On Quartz) substrates are equally well known, and even "SOS" (Silicon On Sapphire) ($Al_2O_3$), where the support has the required high resistivity. However, such substrates may be difficult to obtain with good quality, often being contaminated with metallic impurities.

A good quality thin layer of silicon may also be difficult to obtain, despite whatever well known technology is used to manufacture it (hetero-epitaxy, forming of layer with bonding principally by molecular bonding). Associated problems can arise from the use of such substrates, in particular because certain manufacturers of integrated circuits may refuse to introduce them into their production line, either for reasons of contamination, or because their transparency to light makes them incompatible with some optical sensors used in industrial processes, in particular for metrology purposes, or even because the maximum temperature to which they can be exposed without damage makes them incompatible with certain processes.

It will also be noted that SOQ or SOS substrates of good quality are not available in large diameters.

Another approach could be to produce high frequency integrated circuits in substrates possessing a silicon support layer with normal resistivity (either solid silicon or SOI substrates), then to transfer these circuits to insulating supports. Such techniques could firstly be cumbersome, implying a double turnaround of the circuit, and secondly unsuitable for an industrial process (high cost price, in particular because of the loss of the original supporting layer or the necessity to remove this, and low yield).

Yet another approach might consist in using solid FZ (Float Zone) silicon substrates. The main problem with these substrates is that they are not available today in diameters greater than 150 mm. Another problem is their low residual oxygen content, which firstly makes them mechanically fragile and secondly, by limiting the formation of oxygen precipitates, limits their ability to trap metallic impurities ("gettering").

In addition, the production of high resistance substrates in solid CZ silicon with high resistivity could be considered using a variant of the CZ technique known under the name of MCZ ("Magnetic Field Applied CZ", or "CZ in a magnetic field"), which, however, would involve sacrificing the crystallographic quality of these substrates, making them unsuitable for the production of components in them. In particular, the crystalline quality becomes mediocre, in particular due to the presence of an excess of oxygen precipitates, a mass of holes-known under the acronym of COPS (Crystal Originated Particles), which would prevent the production of high quality circuits with an acceptable yield.

It will also be noted that in solid substrates of FZ or CZ silicon, the useful layer and the substrate mass forming the support for the useful layer would come from the same slice or the same ingot of silicon, which presents a degree of constraint for the designers. In particular, while the presence of faults in the mass of the ingot does not in general pose insurmountable problems, the presence of such faults in the neighborhood of the surface of the useful part of a substrate cut from such an ingot makes it unsuitable for its purpose and the rate of rejection is high.

Finally, one could consider producing such high frequency circuits on SOI substrates whose support layer would be in FZ silicon, or even on a substrate whose useful layer would be formed by bonding onto such a FZ silicon support layer, in order to obtain the same decoupling between the useful layer and support layer. However, one would still have problems, in particular the limitation of the diameter to 150 mm today.

In addition, PCT application WO00/55397 describes a process for the manufacture of a substrate in silicon starting from an CZ silicon ingot with a particular interstitial oxygen content 01, then using a thermal precipitation treatment, reducing the interstitial oxygen content to obtain a substrate that maintains a high resistivity while presenting grains of oxygen precipitates (suitable for the purpose of trapping metallic impurities) and suitable mechanical strength.

This document also describes the production of a substrate of the SOI type by the bonding of a useful layer onto such a high resistivity substrate and in this case the thermal precipitation treatment is preferably performed after bonding and also serves to strengthen the bonding interface. This technique however has certain problems. In the first place, it may in some cases be required not to subject the useful layer to excessive temperatures (particularly with useful layers in gallium arsenide AsGa or in indium phosphide InP, or even useful layers in pre-treated silicon implying limitations relating to the subsequent exposure to high temperatures) and such materials may then be incompatible with this known process.

Secondly, the fact that heat treatment necessary for precipitation must also be designed in the perspective of reinforcement of the bonding interface results in an obvious lack of flexibility, knowing that it could be difficult to produce a satisfactory compromise between the adequate treatment for the work on the bonding interface and adequate treatment for precipitation and stabilization. It must therefore be noted in this regard, the behavior of oxygen in the field of electrical donor generation and precipitation and growth of precipitant grains varies especially as a function of conditions (duration and temperature) of the different phases of heat treatment.

Finally and most importantly, in the case of an SOI, the interstitial oxygen content Oi and its behavior in the vicinity of an insulting layer of oxygen separating the base of the useful layer are poorly controlled, especially as concerns the way in which the oxygen is capable of outwardly diffusing into the oxide layer. Consequently, one risks having, without these phenomena being capable of being controlled: either an Oi content that is locally too low to obtain satisfactory formation of precipitates; or, on the other hand, an Oi that is locally too high, leading to a significant lowering of resistivity and /or to a stability defect in this resistivity (which could, in particular, drop at the time of subsequent exposure to elevated temperatures, for example during realization of the components).

Accordingly, improvements in these methods are desired.

SUMMARY OF THE INVENTION

The present invention relates to a method for fabricating a substrate containing a useful semiconductor layer on a support having a high resistivity suitable for producing high frequency electronic circuits, which comprises: preparing a base substrate made of a semiconductor material that includes a controlled amount of interstitial oxygen; heat treating the substrate to precipitate some of the interstitial oxygen therefrom; removing a superficial layer from a surface of the base substrate that is intended to receive a useful layer, wherein the superficial layer is oxygen depleted or includes undesirable electron donors due to the heat treating; and forming the useful layer on the base substrate surface, wherein the base substrate acts as a support for the useful layer.

This method is particularly applicable to SOI substrates having high resistivity for use in forming high frequency electronic circuits.

BRIEF DESCRIPTION OF THE DRAWING FIGURES

Other features, objects and advantages of the present invention will become more apparent when reading the following detailed description of a preferred embodiment, provided as a non-limiting example, with reference to the attached drawing, wherein:

FIG. 1 is a schematic of the principal steps of an exemplary process for manufacturing substrates according to the invention; and FIGS. 2A-2F diagrammatically represent in transverse section the different states of materials in a particular case of implementation of the process of FIG. 1.

DETAILED DESCRIPTION OF THE PREFERRED EMBODIMENTS

The present invention now provides a solution to the limitations of the prior art. It specifically provides, in the context of realization of substrates implementing an operation for forming a useful layer on a support, a manufacturing method for a substrate with a base layer having elevated resistivity, wherein at least one of the following advantages can be achieved:

preserving and stabilizing the natural resistivity of the material used for the support, including in the vicinity of the useful layer;

assuring the surface qualities enabling satisfactory deposition or bonding of the useful layer;

assuring and stabilizing the qualities of the support in the vicinity of the useful layer especially in terms of trapping impurities, and obtaining a substrate having good mechanical properties.

Accordingly, the present invention proposes a method for fabricating a substrate of SOI-type containing a useful semiconductor layer on a support having a high resistivity suitable for producing high frequency electronic circuits, by the following successive steps: (a) preparing a base substrate made of semiconductor material comprising a controlled quantity of interstitial oxygen; (b) conducting a heat treatment defined so as to produce at least partial precipitation of the interstitial oxygen of the base substrate; (c) on one surface of the base substrate for receiving a useful layer, eliminating a superficial layer to a controlled depth; (d) forming the useful layer on the surface of the base substrate, the latter foiling the support for the useful layer.

Certain preferred non-limiting features of this process include the following. The base substrate is preferably formed by fabrication of a silicon ingot by the MCZ method and cutting out a portion of this ingot for use as the base substrate.

The concentration of interstitial oxygen in the base substrate is greater than or equal to approximately $15 \times 10^{17}$/cc.

The useful layer is preferably carried out by layer transfer from a donor plate or wafer. This can be performed by creating in a donor wafer, by implantation of gas species, of a weakened zone located under the surface and intended for delimiting the useful layer, bonding the wafer onto the base substrate at the surface, and detaching the useful layer relative to the rest of the donor wafer by application of stresses at the weakened zone. These stresses are typically of thermal and/or mechanical origin, as is generally known in the art. The donor wafer is preferably made of a material chosen from the group consisting of silicon, silicon-germanium, gallium arsenide, indium phosphide, silicon carbide, and gallium nitride.

Step (b) can be implemented to also provide stabilization of the precipitated oxygen. To do this, step (b) preferably comprises at least two, and preferably three, heat treatments at different temperatures, with the heat treatments being carried out in progressively increasing temperature ranges.

Step (c) is common to at least one polishing operation applied to the base substrate surface. In particular, step (c) comprises an operation chosen from the group consisting of mechano-chemical polishing, dry or wet etching, and sacrificial oxidation. This is done to remove a thickness of approximately between 0.5 µm and 10 µm.

The method also comprises, prior to step (d), a step for forming an insulating layer on the useful layer and/or on the base substrate, with this insulating layer being disposed between the useful layer and the base substrate after step (d).

With reference to the Figures, initially a base substrate 10 (FIG. 2B) is prepared for forming a support layer having elevated resistivity, typically of 1,000 ohm.cm or more, using an SOI substrate for radiofrequency or microwave circuits.

Figure 2:
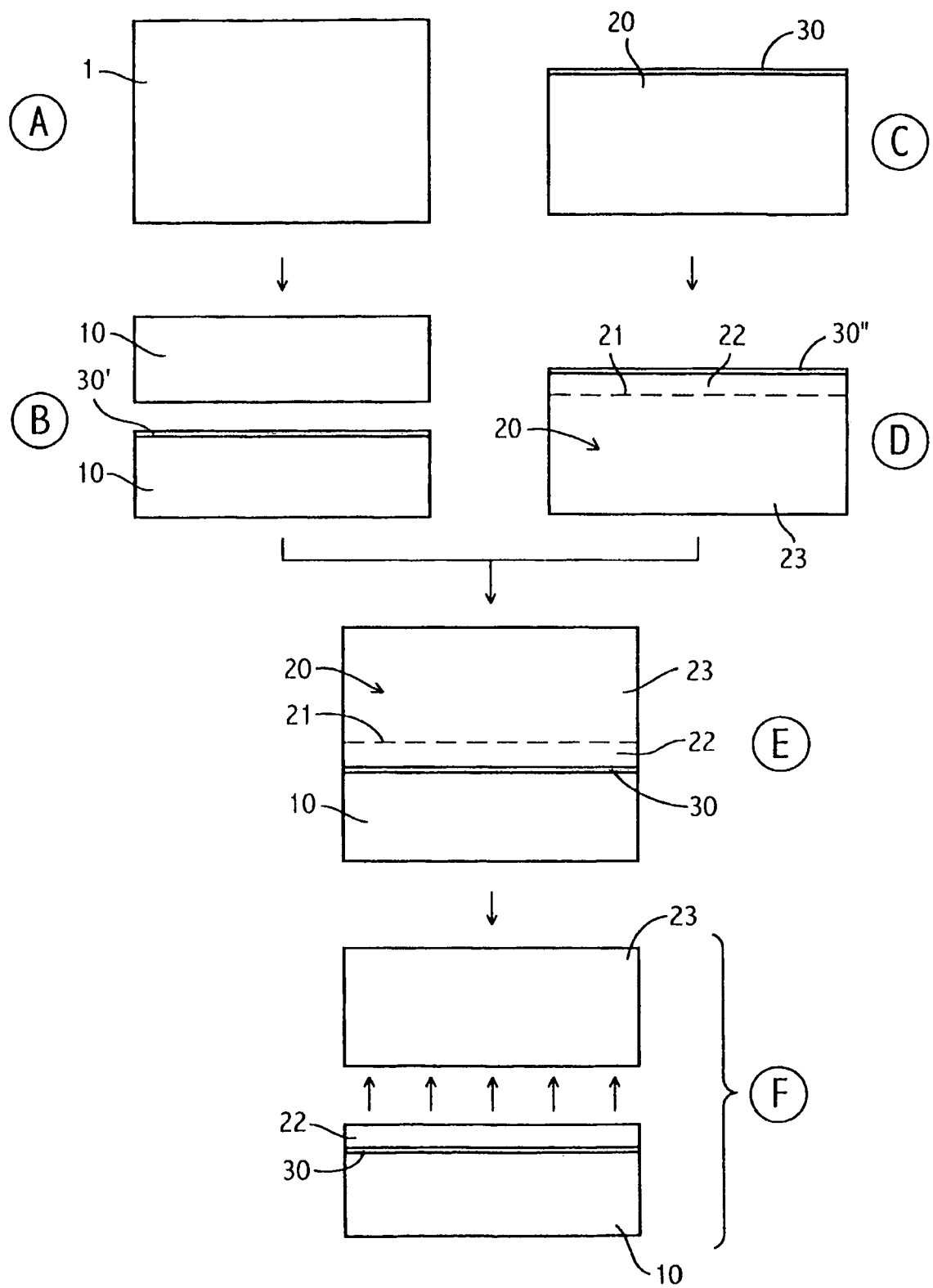

For this purpose, an MCZ silicon ingot 1 (FIG. 2A) is grown using the classical technique (step 100), following which said ingot is cut in step 110, for example, by sawing into slices 10 of a given thickness (FIG. 2B). For example, a typical slice has a diameter of 200 µm and a thickness of 725 µm. Each of these slices forms a base substrate as will be seen below. It should be noted at this point that the crystal comprises a relatively significant quantity of interstitial oxygen, typically of the order of $15 \times 10^{17}$/cc or more.

Heat treatment (step 120) is then applied to the base substrate 10 for producing precipitation of the interstitial oxygen and stabilizing the precipitates; this being done for the purpose of giving the base substrate the desired highly resistant character for ensuring nucleation phases (formation of the nuclei of precipitates) and growth of the nuclei, comprises a succession of phases at progressively increasing temperatures and over defined periods of time. For example, useful heat treating conditions include: 650° C. for 2 hours, preferably 800° C. for 2 hours, and most preferably 1000° C. for 4 hours.

These parameters can, however, vary widely while preferably respecting the following rule. A temperature progression must be assured—the progression must comprise marked steps or even phases, during which the temperature rise is very slow. The temperature at the start of treatment is between approximately 400 and 650° C., while the temperature at the end of treatment is between approximately 1000° C. and 1100° C. It should be recognized that if a certain temperature is exceeded, typically between 1100 and 1200° C., there is the risk of abruptly dissolving the oxygen precipitates that are formed.

At the end of this precipitation annealing operation, the substrate 10 is subjected, on its surface intended for receiving a thin usable surface as will be detailed in the following, to a polishing step 130 for obtaining in the usual fashion a surface roughness that is sufficiently low to allow good bonding quality by molecular adhesion that is carried out later. It has been observed, however, according to one feature of the invention, that such polishing, if it were used for removing a quantity of material greater than that removed with classical polishing, would have other appreciable advantages. More precisely, removal of the material of a certain thickness, which results from such polishing, contributes to significantly improving the quality of the base substrate in the vicinity of the surface that will receive the thin useful layer.

In fact, it has been found that at the end of the precipitation annealing operation, the behavior of the oxygen in the zone situated in the vicinity of the exposed surface of the base substrate that is to receive the useful layer was poorly controlled. More precisely, the following poorly controlled phenomena can be seen in this zone in connection with the heat treatment. Exodiffusion of oxygen, which results in a zone depleted of oxygen and, consequently, depleted of oxygen precipitates contributing to trapping of impurities (commonly known as the denuded zone). Poor stabilization of the interstitial oxygen, where the Oi atoms being capable of regrouping with other atoms to form electrical donors capable of lowering considerably, by the untimely doping that they bring about, the resistivity of the support layer. Thus, in realizing an elimination of the base substrate material at this zone by polishing, the aforementioned problems are resolved, because one then obtains a zone of support material for receiving the useful layer. This zone is only minimally affected or not at all affected by the aforesaid phenomena.

Accordingly, the structure obtained will have advantageous qualities. Principally the stability of the residual interstitial oxygen thus preserving and stabilizing electrical resistivity. Secondarily, to preserve oxygen precipitate content contributing to the trapping effect. Finally, to preserve structural uniformity and mechanical resistance of the substrate.

Removal of the aforesaid material is implemented in one or more steps using one of the methods available on the market or a combination thereof. One can mention in particular the mechano-chemical polishing techniques, dry chemical etching (by plasma) or wet chemical etching (etching bath) or even the sacrificial oxidation techniques (oxidation of the material at a controlled depth followed by selective chemical etching of the oxide) in combination with other techniques.

In one preferred embodiment, a mechano-chemical polishing step is used followed by a finishing step by chemical etching or sacrificial oxidation or even a chemical etching step followed by a mechano-chemical polishing step. Preferably, polishing is done to globally remove a thickness of material on the order of 0.5 µm to 10 µm, this value being chosen on the basis of experience as a function of the scope of the aforementioned phenomena.

Then, the polished surface can be (in a maimer not shown in FIG. 1), if necessary, subjected to a step for forming a classical insulating layer in itself (layer 30', 30"); in FIG. 2B).

In the case of a species, where the useful layer of the final SOI substrate is produced by a layer transfer technique such as the SMART-CUT® process, a donor substrate 20 (FIG. 2C), typically comprised of monocrystalline silicon, in its turn, is subjected in classical fashion to thermal oxidation (step 200) or even to oxide deposition, for forming an oxide layer 30", then to a step for creating a weakened zone 21 (FIG. 2D) at a given depth under the oxide layer (not shown), preferably by implantation of gas species (step 210); this weakened zone delimits a thin layer 22 on the oxide side relative to the rest 23 of the donor substrate 20 and this thin layer constitutes the useful layer.

Bonding by molecular adhesion is then carried out (step 140; FIG. 2E) at a bonding interface between the oxide layers 30', 30" of the base substrate 10 and the donor substrate 20 so that in the end they form the buried oxide 30 of the SOI substrate (FIG. 2F).

Heat treatment in one or more steps is then done (steps globally indicated at 150); this treatment being intended essentially to participate in the detachment of the weakened zone 21; to reinforce the bonding interface; to stabilize and improve the crystalline structure of the SOI substrate formed; and, if required, to carry out the oxidation phase of a finishing step by sacrificial oxidation.

In this respect, FIG. 2F represents the situation after complete detachment along the weakened zone 21. On one side the desired high resistivity SOI substrate is obtained, with the layer 10 forming the support and the thin layer 22 forming the useful layer, the oxide 30 produced on this latter is situated at the bonding interface forming the insulator.

If required, these steps can also play a role in the precipitation of an interstitial oxygen remnant situated in the support 10 and not precipitated at the time of the precipitation annealing operation, or even in stabilization, principal or supplementary, of the precipitates formed at the time of said specific annealing.

Obviously, the present invention is in no way limited to the embodiment described above and represented in the drawings. In particular, it applies to SOI substrates in which the support layer has a target resistivity that can vary widely and be made of diverse semiconductor materials.

One can mention especially SOI substrates comprising a useful layer of silicon-germanium, gallium arsenide, indium phosphide on a high-resistivity silicon support, substrates that are particularly used for producing high-frequency circuits. Useful layers can also be provided that are made of germanium, gallium nitride, silicon carbide, etc.

It should be noted at this point that for realizing useful layers made of gallium arsenide or indium phosphide, it is particularly important to carry out the essential step of heat treatment for precipitating the oxygen and stabilizing it in the Si support prior to bonding, because these materials must not be exposed to very high temperatures. Typically, these temperatures must not exceed 300 to 400° C. if the materials are not protected and 700 to 800° C. if the materials are covered with a protective layer ($SiO_2$, for example) or if annealing is done under a specific atmosphere (arsine, phosphine, etc.).

Furthermore, the present invention applies also to the case, where the usable thin layer is applied to the support by various thin layer application techniques (typically the "bond and etch back" layer application techniques or even the type commonly known by the commercial name ELT-RAN, or further still in the case, where the thin useful layer is formed directly on the support, by epitaxy for example, the preparation of the support being similar in this instance.

What is claimed is:

1. A method for fabricating a substrate containing a useful semiconductor layer on a support having a high resistivity suitable for producing high frequency electronic circuits, which comprises:
    preparing a base substrate made of a semiconductor material that includes a controlled amount of interstitial oxygen;
    heat treating the substrate to precipitate some of the interstitial oxygen therefrom, and forming a treated zone where oxygen is depleted or includes undesirable electron donors due to the heat treating;
    removing a superficial layer comprising the entire treated zone from a surface of the base substrate that is intended to receive a useful layer; and
    forming the useful layer on the base substrate surface, wherein the base substrate acts as a support for the useful layer.

2. The method of claim 1, wherein the base substrate is a semiconductor of the SOI-type.

3. The method of claim 1, wherein the base substrate is made by fabrication of a silicon ingot, using the MCZ process, and removing a portion of this ingot as the base substrate.

4. The method of claim 3, wherein the base substrate has a concentration of interstitial oxygen that is approximately $15 \times 10^{17}$/cc or higher prior to oxygen precipitation.

5. The method of claim 1, wherein the useful layer is formed by transfer from a donor wafer.

6. The method of claim 5, wherein the useful layer is transferred by implanting gaseous species in the donor wafer to create a weakened zone located under one surface of the wafer intended to delimit the useful layer, bonding the donor wafer onto the base substrate at the surface, and detaching the useful layer from the remainder of the donor wafer by applying stresses at the weakened zone.

7. The method of claim 1, wherein the heat treating is implemented to achieve stabilization of precipitated oxygen.

8. The method of claim 1, wherein the heat treating comprises multiple heat treatments at different temperatures.

9. The method of claim 8, wherein the multiple heat treatments are conducted at increasingly higher temperature ranges.

10. The method of claim 1, wherein the superficial layer is removed by at least one polishing operation conducted on the surface of the base substrate.

11. The method of claim 1, wherein the superficial layer is removed by mechanical-chemical polishing, dry or wet etching, or sacrificial oxidation.

12. The method of claim 1, wherein approximately 0.5 μm to approximately 10 μm of the superficial layer is removed.

13. The method of claim 1, wherein the donor wafer comprises a material selected from the group consisting of silicon, silicon-germanium, gallium arsenide, indium phosphide, silicon carbide and gallium nitride.

14. The method of claim 1, which further comprises, prior to removing the superficial layer, forming an insulating layer on one of the useful layer or the base substrate, so that the insulating layer is located between the useful layer and the base substrate after the superficial layer is removed.

* * * * *